United States Patent
Goldberg et al.

(10) Patent No.: US 6,690,580 B1
(45) Date of Patent: Feb. 10, 2004

(54) INTEGRATED CIRCUIT STRUCTURE WITH DIELECTRIC ISLANDS IN METALLIZED REGIONS

(75) Inventors: Cindy K. Goldberg, Austin, TX (US); John Iacoponi, Austin, TX (US)

(73) Assignees: AMD, Inc., Sunnyvale, CA (US); Motorola, Inc., Shaumberg, IL (US)

( * ) Notice: Subject to any disclaimer, the term of this patent is extended or adjusted under 35 U.S.C. 154(b) by 0 days.

(21) Appl. No.: 10/091,998

(22) Filed: Mar. 7, 2002

(51) Int. Cl.⁷ ................................................ H05K 7/00
(52) U.S. Cl. .................... 361/735; 361/790; 361/791; 361/792; 361/793; 361/794; 361/795; 361/748; 361/750; 361/751; 361/736; 361/746; 361/764; 174/256; 174/258
(58) Field of Search ........................ 361/748, 750, 361/751, 735, 736, 746, 790, 791, 792, 793, 764, 794, 795; 174/256, 258

(56) References Cited

U.S. PATENT DOCUMENTS 5,479,827 A * 1/1996 Kimura et al. ................ 73/718
6,388,207 B1 * 5/2002 Figueroa et al. ............ 174/262
6,423,571 B2 * 7/2002 Ogino et al. ................ 438/106
6,430,058 B1 * 8/2002 Sankman et al. ............ 361/773
6,534,723 B1 * 3/2003 Asai et al. ................... 174/255

* cited by examiner

*Primary Examiner*—David Martin
*Assistant Examiner*—Thanh Yen Tran
(74) *Attorney, Agent, or Firm*—Charles E. Graves (57) ABSTRACT

This disclosure describes use of dielectric islands embedded in metallized regions of a semiconductor device. The islands are formed in a cavity of a dielectric layer, as upright pillars attached at their base to an underlying dielectric. The islands break up the metal-dielectric interface and thus resist delamination of metal at this interface. The top of each island pillar is recessed from the cavity entrance by a selected vertical distance. This distance may be varied within certain ranges, to place the island tops in optimal positions below the top surface plane of the dielectric. Metallization introduced into the cavity containing the islands, submerges the island tops to at least a minimum distance to provide a needed minimum thickness of continuous metal. The continuous metal surface serves favorably as a last metal layer for attaching solder or for bump-bonding package to the IC; and also serves as an intermediate test or probe pad in an interior layer.

15 Claims, 10 Drawing Sheets

INTEGRATED CIRCUIT STRUCTURE WITH DIELECTRIC ISLANDS IN METALLIZED REGIONS

CROSS-REFERENCES TO RELATED APPLICATIONS

Not Applicable.

STATEMENT REGARDING FEDERALLY SPONSORED RESEARCH AND DEVELOPMENT

Not Applicable.

REFERENCE TO SEQUENTIAL LISTING, TABLE, COMPUTER PROGRAM LISTING ON CD

Not Applicable.

BACKGROUND OF THE INVENTION (1) Field of the Invention

This invention relates to integrated circuits; and more particularly to use of dielectric islands embedded in metallized regions of a semiconductor device to improve metal adherence to an underlying dielectric layer.

(2) Background Art

In integrated circuit ("IC") manufacture, when forming metal or barrier regions in one dielectric layer which contact the underlying dielectric layer, it is sometimes necessary to compensate for an inherently weak metal-dielectric adhesion in order to prevent de-lamination at the metal-dielectric interface. One method for strengthening metal-dielectric adhesion is to break up a large all-metal area at the metal-dielectric interface into a series of smaller metal features separated by areas of, for example, an oxide dielectric such as $SiO_2$. This process involves forming a cavity in the top metal dielectric to contain the metallization, and providing dielectric islands or pillars extending from the metal-dielectric interface upwardly into the cavity. The islands promote stronger adhesion of the metal to the dielectric layer beneath by adhering more firmly than metal to the underlying dielectric, by adding vertical surface area to which metallization can adhere, and by limiting the incidence of long, continuous metal regions at the interface which become prone to delamination.

Providing islands is useful in inlaid copper technology where adhesion of copper and/or barrier layers to an underlying dielectric is particularly weak due, for example, to formation of an unwanted layer at the metal- (or barrier-) dielectric interface or diffusion of halide species to the interface. Islands are also useful in manufacture of damascene interconnect structures, where it is frequently preferred to use low-k (dielectric constant $\leq 3.9$) materials. Low-k dielectric materials characteristically form particularly weak metal-dielectric bonds.

The islands of the prior art extend from the underlying dielectric to the top surface of the surrounding metallization. Such a surface is adequate for some purposes, such as to form probe pads for conducting electrical tests at stages of the IC production. The islands break up the large area of probe pad metal which can be in excess of 100 um×100 um in size, thus aiding in the adhesion of, for example, Ta barrier metal to the underlying dielectric material. For attaching wire or bump bonding packages to the IC, however, it is desirable for both electrical and mechanical performance reasons to have a continuous, uninterrupted metal surface for the last metal bond pad to which the wire-bonded or solder-bonded lead is attached. A surface including the tops of islands therefore is not an optimal choice for a last-metal which must support bonding, especially for inlaid copper technology. The problem therefore is to realize an island structure that provides improved metal-dielectric adhesion to resist delamination; and that also provides an upper surface suitable either for testing or for mounting bond packages which is optimized both electrically and mechanically.

SUMMARY OF THE INVENTION

An array of islands of dielectric material is created in a cavity within the dielectric layer where the metallization for the test or bond pad will be placed. The base of each island contacts the underlying dielectric layer, thus to break up the metal-dielectric interface and provide added resistance to delamination. The top of each island is recessed by a selected vertical distance which may be varied within certain ranges, to place the island tops below the plane of the test pad or bonding surface. Metallization introduced into the cavity containing the islands submerges the island tops in a sea of metal. The surface then is given CMP treatment for planarization and removal of unwanted metal.

The islands may be formed within the metallization cavity in a regular X-Y matrix. Other configurations of recessed oxide islands may be used to, for example, concentrate the islands in the interior region of the metallization cavity. In top-down projection view, the submerged islands may be rectangular or circular; or some other shape such as a "T" or an "L" juxtaposed to reduce the incidence of long linear metal runs at the metal-dielectric interface that contribute to delamination. Buried islands are advantageous either in a last-metal dielectric layer and/or in interior probe pad layers of the IC stack.

The islands may be created by conventional etching processes in which photomasks define the metallization cavity and the island pillars. Using a gaseous vertical anisotropic etch regime, the etch proceeds to the cavity floor. A second stage etch vertically reduces the height of the pillars to the desired plane of recess. The recessing depth of the island tops are held within the range that is optimal to achieve certain electrical and mechanical objectives, but which meets at least a required minimum recessing depth.

The islands typically, although not necessarily, are created by etching the material of which the metal-containing dielectric layer is composed, for example, $SiO_2$.

DETAILED DESCRIPTION

Figure 1:
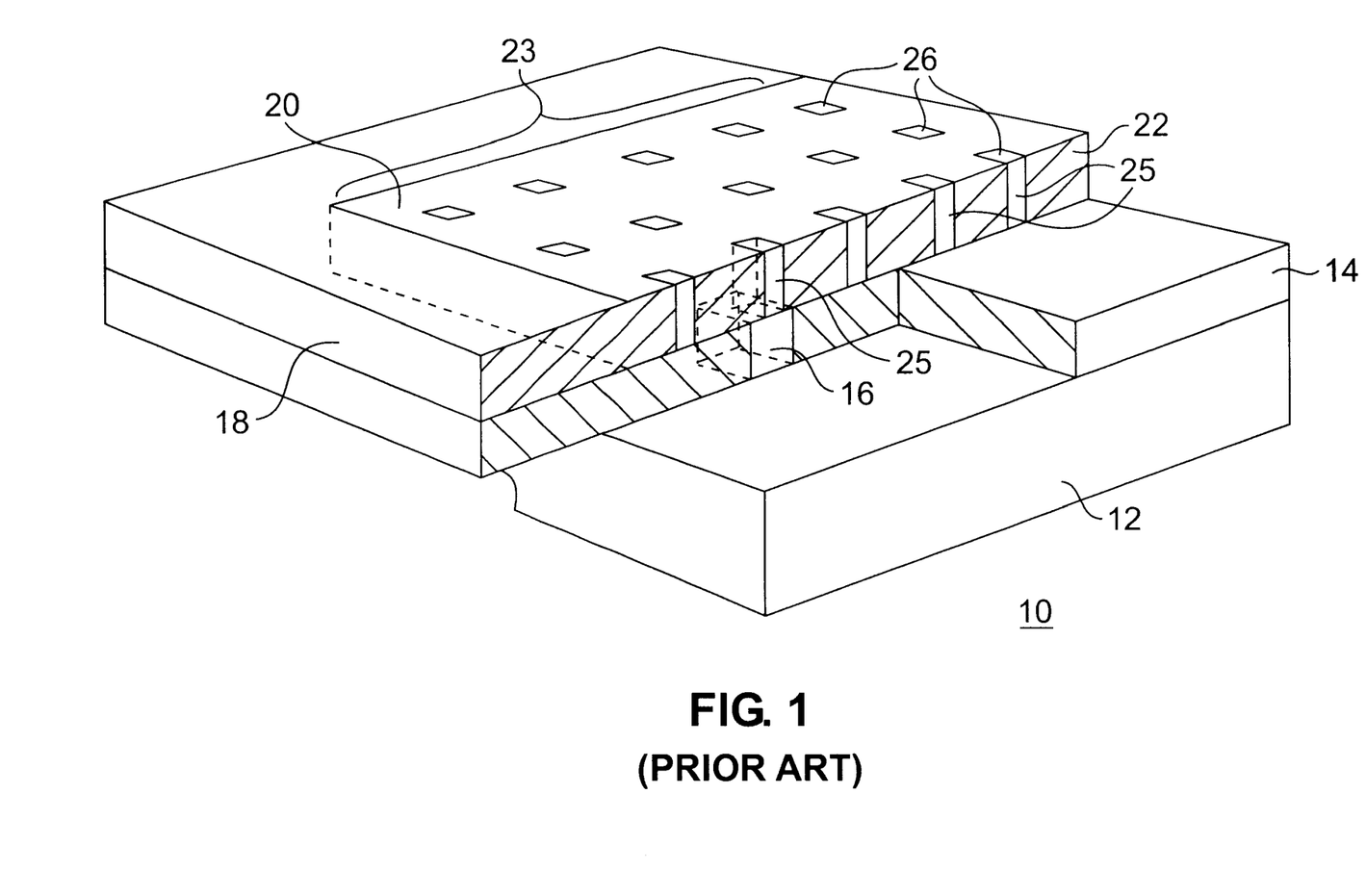
FIG. 1 is schematic perspective diagram of a partial IC of the prior art employing islands.

Referring to FIG. 1, there is shown a partial integrated circuit stack 10 employing islands of the prior art. The lowermost element of stack 10 comprises a semiconductor wafer 12 having a plurality of conductive and dielectric layers containing conventional resistors, capacitors, transistors and other active devices (none shown). A via dielectric layer 14 is formed on top of wafer 12. Via holes exemplified by hole 16 are formed through dielectric layer 14 and filled with metal such as copper to provide electric connection to the components in wafer 12.

A top metal dielectric 18 is formed on top of dielectric layer 14. Using conventional photolithography which defines island arrays, an interior cavity 20 is etched through dielectric 18 to the top surface of dielectric layer 14. The etch creates, from the material of dielectric 18, an array of pillars or islands 25 formed in cavity 20 in an X–Y matrix as shown in FIG. 1. Metallization 22 is placed in interior cavity 20. By bonding firmly to the underlying dielectric material of layer 14 and providing added surface for metallization 22 to adhere to, islands 25 add structural integrity to the dielectric/metallization interface along the top of dielectric layer 14.

Using a CMP process, for example, the top surfaces 26 of the oxide islands 25 and the top surface of metallization 22 are made coplanar with the top surface of dielectric 18. This dielectric-metal surface provides an adequate large-area test or probe pad 23; but does not afford a suitable last-metal surface for attaching a wire-bonded or solder-bonded package.

Figure 2A:
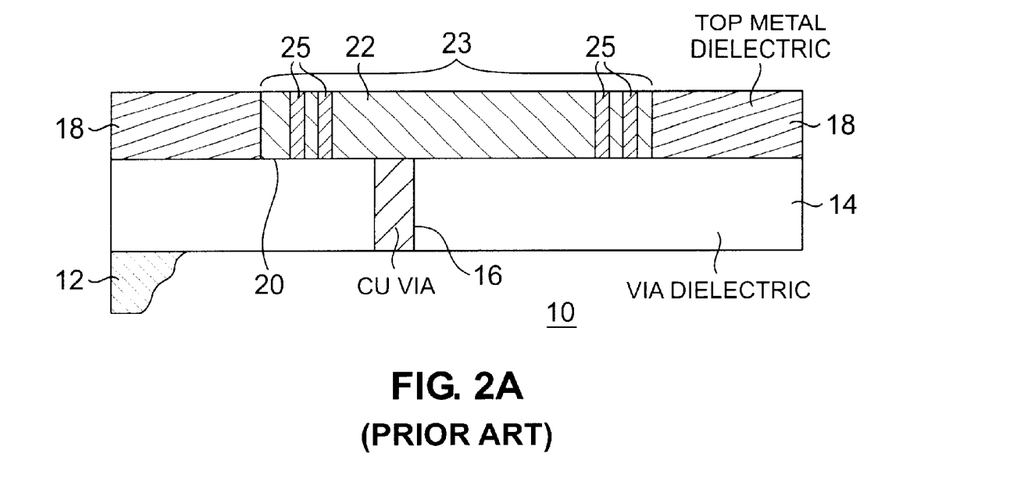
FIGS. 2A and 2B are sectional elevation and plan views of two prior art structures based on structure of FIG. 1.
Figure 2B:
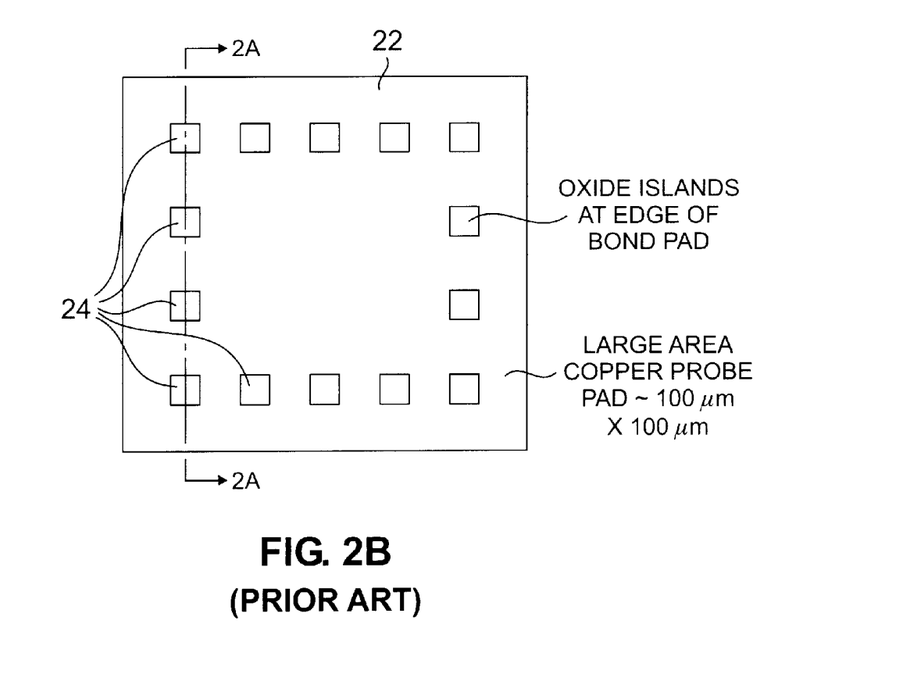

An alternative island configuration of the prior art is illustrated in FIGS. 2A and 2B, in which numerical callouts correspond to elements of FIG. 1. Islands 25 formed from the Sio$_2$ dielectric material of layer 18 are located in one or two rectangular arrays around the edge of metallization 22. The oxide-metal top surface of the resulting pad 23 provides greater metallic area for mounting a bonding package; but the presence of oxide surface in pad 23 still reduces bonding strength and electrical paths.

Figure 3A:
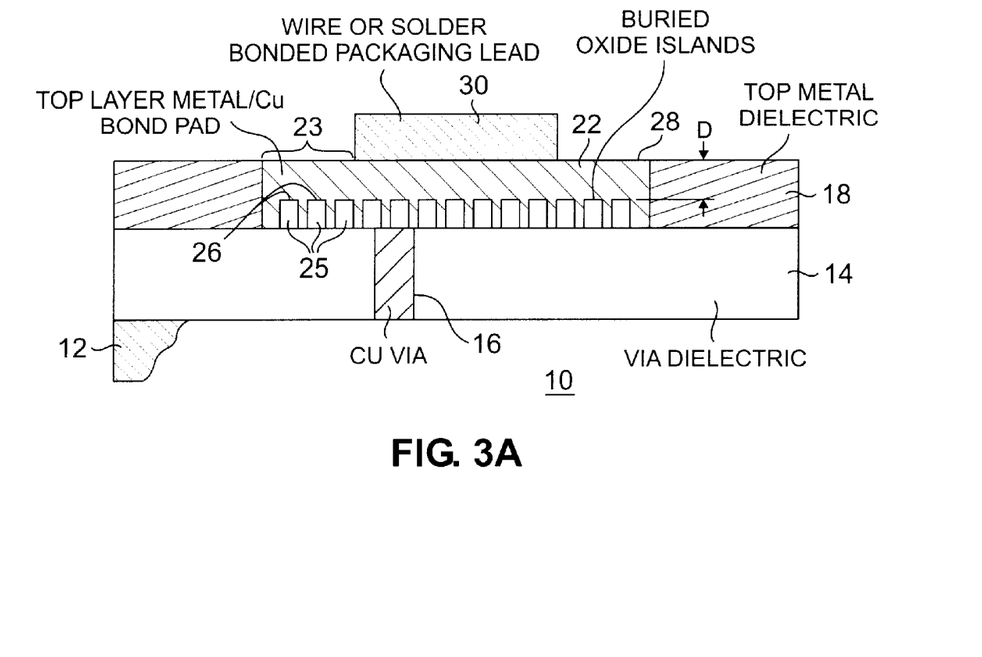
FIGS. 3A and 3B are sectional elevation and plan views of a last-metal portion of an IC using recessed islands.
Figure 3B:
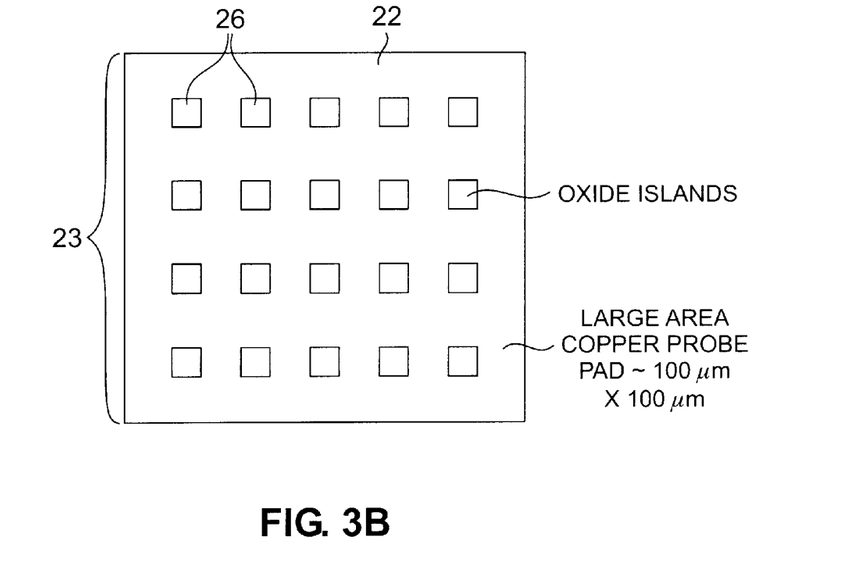

The delamination resistance of islands are still realized, and at the same time needed electrical/mechanical properties of the top metal dielectric are achieved either for a probe pad or for attaching wire or bump bonding packages, by a controlled recessing the top surfaces of the islands 25 into metallization 22. Referring to FIGS. 3A and 3B, an X–Y array of islands 25 are all reduced in height while the thickness depicted in FIG. 2A of dielectric layer 18 and metallization 22 is retained. The metallization 22 now submerges top surfaces of islands 25 in metal, to provide a continuous and uninterrupted metal surface 28 for a test pad or as a last-metal to which the wire-bonded or solder-bonded packaging leads of package 30 are attached.

Figure 4:
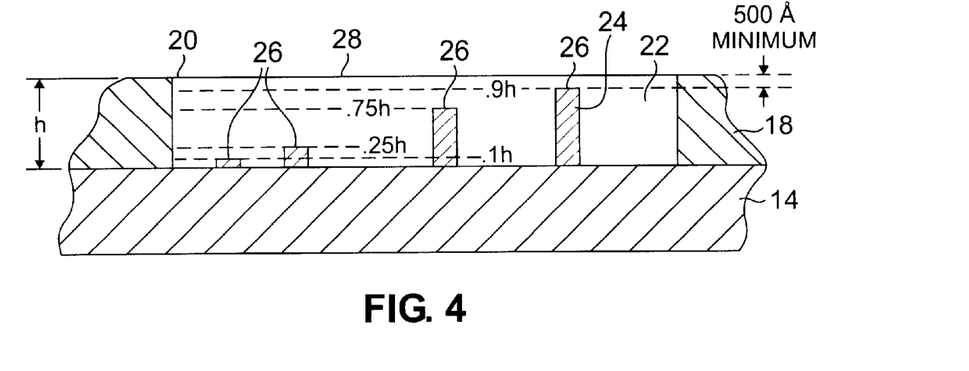
FIG. 4 is schematic sectional elevation view showing critical dimensional controls on the structure of FIG. 3A.

The dimension "D" in FIG. 3A is the distance by which the top surfaces 26 of islands 25 and the final surface of metallization 22 are separated. Controlling the depth of submersion of top surfaces 26 into metallization 22 is essential, as described next. The thickness of top dielectric 18 and of metallization 22 in typical current ICs is on the order of 1 micron, denoted by the dimension "h" in FIG. 4. In the final structures shown in FIG. 3A and FIG. 4, it is desirable that a minimum of approximately 500 Angstroms of metallization above island top surfaces 26 be maintained to provide adequate electrical conductive paths. A workable range within which to maintain the heights of islands 25 therefore is from 0.1 h to 0.9 h as illustrated in FIG. 4 which provides for a recess distance meeting the criteria of $\geq 0.9$ h and $\leq 500$ Angstroms. For relative ease of fabrication a preferred range is substantially from 0.25 h to 0.75 h, which provides a more readily attainable safety margin to assure the minimum of about 500 Angstroms of metallization above the tops 26 of islands 25, as well as assuring enough island height to create adequate vertical island surface 24 to which metallization 22 can adhere.

Figure 5A:
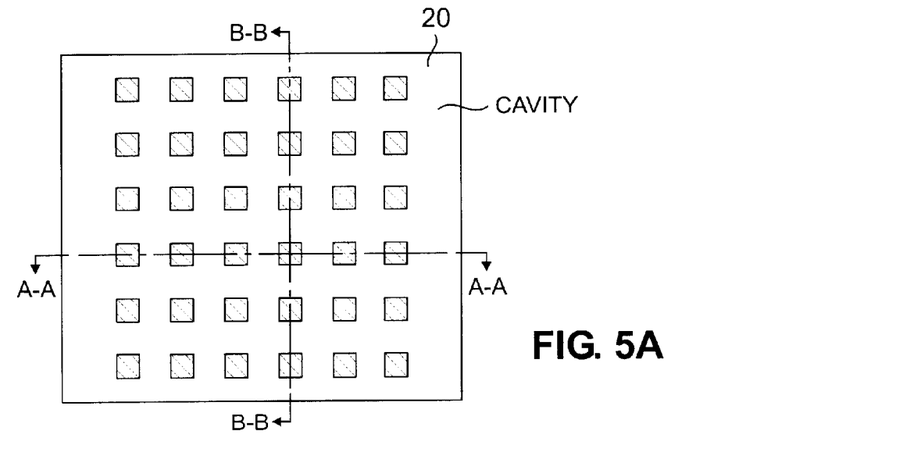
FIGS. 5A, 5B and 5C are sketches in plan and elevation view illustrating use of differential island heights.
Figure 5B:
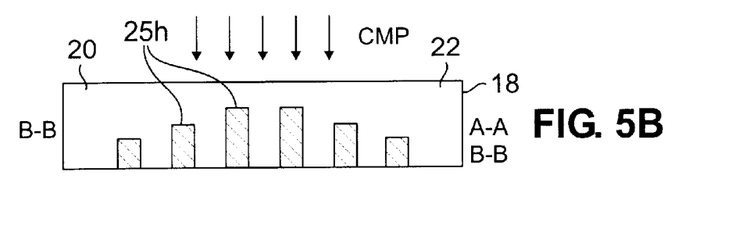

It is not necessary that all islands 25 be of the same height, provided their respective heights are within the above-noted height parameters. Although specifying a uniform height for all islands 25 may simplify formation processes, it may also be advantageous to realize island heights which are relatively greater for islands disposed toward the interior of cavity 20, to reduce dishing effects during final CMP of the metallization 22 top surface 28. To illustrate, when the X-Y matrix of islands in FIG. 5A are of uniform height, a result of the CMP step is the dishing condition of FIG. 5C. Dishing occurs in the FIG. 5C structure because of the difference in polish rates between metal and dielectric, and topography of the metal prior to polish. However, by providing relatively taller islands 25h in the interior regions of cavity 20 as in FIG. 5B, the final CMP step creates substantially less dishing and therefore allows greater planarity to be achieved. It is preferable to provide a gradient of height differential from the cavity 20 edges to the cavity center region, as shown in FIG. 5B. The desired profile of island heights can be readily ascertained for any specific island array by differentially adjusting vertical etch processing and electing the profile that minimizes dishing.

Figure 6:
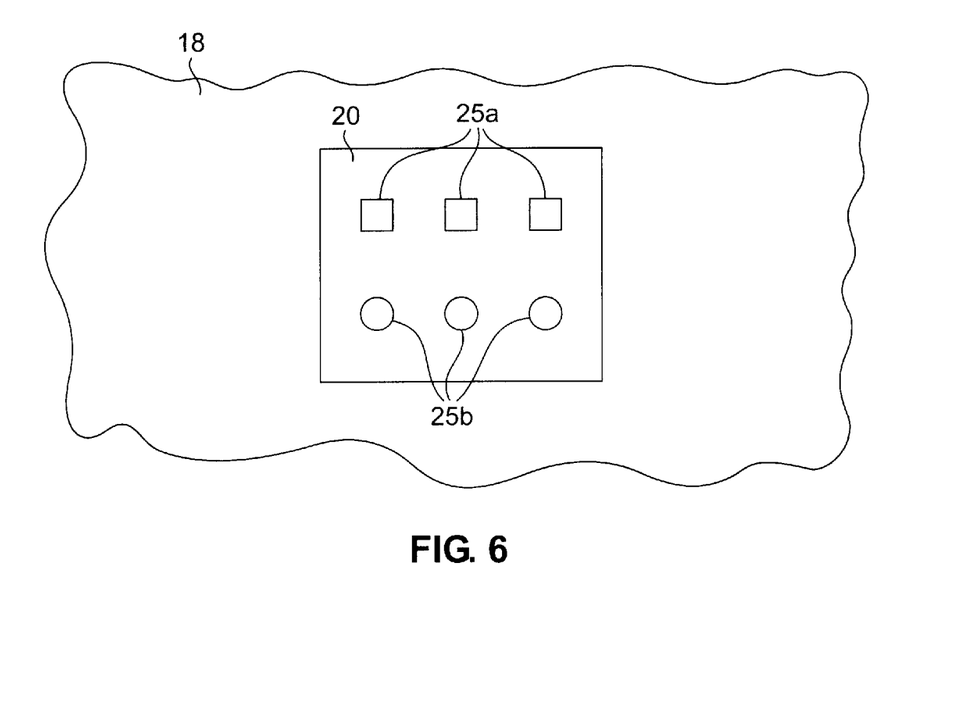
FIGS. 6 and 7 are sketches illustrating alternative geometry and shapes for islands.
Figure 7:
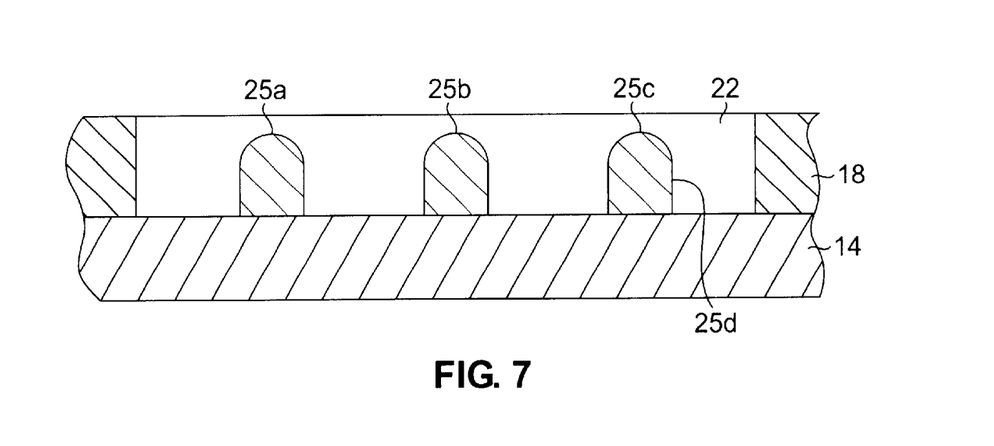

Typical etching processes round off the edges of nominally rectangular vertical surfaces of islands as shown by island 25a in FIGS. 6 and 7. A further variation therefore is to provide for essentially cylindrical islands 25b. Another variation on the geometry of islands 25 is to use an etch process that narrows the waist portion 25d of the island 25c as illustrated in FIG. 7, which more firmly locks in the metallization 22.

Figure 8:
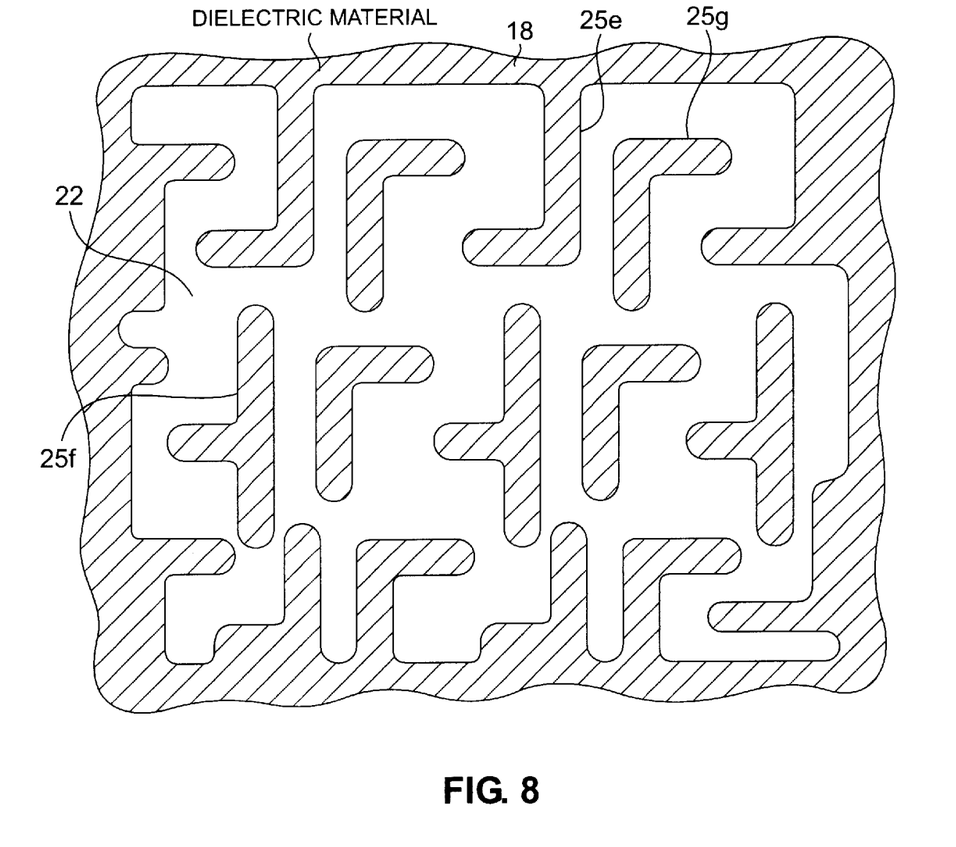
FIG. 8 is a sketch in plan view of island shapes minimizing long linear metal runs.

Islands 25 are shown for purposes of illustration as an X-Y array in FIGS. 3A and 5A, for example; or as a rectangular band array in FIGS. 2A and 2B. These island configurations contain long linear runs of metallization 22 within cavity 20. To further safeguard against delamination, it is advantageous to avoid long linear metallization runs. This may be achieved as illustrated in FIG. 8, by forming islands 25 in shapes that break up the continuous metallization paths. Such island shapes may vary greatly, and can be either regular or irregular. The exemplary island shapes and arrays shown in FIG. 8 include T-shaped islands 25f, L-shaped islands 25g, and islands 25e extending from the dielectric sidewalls of cavity 20. It is seen from FIG. 8 that long linear metal runs are greatly reduced.

Figure 9:
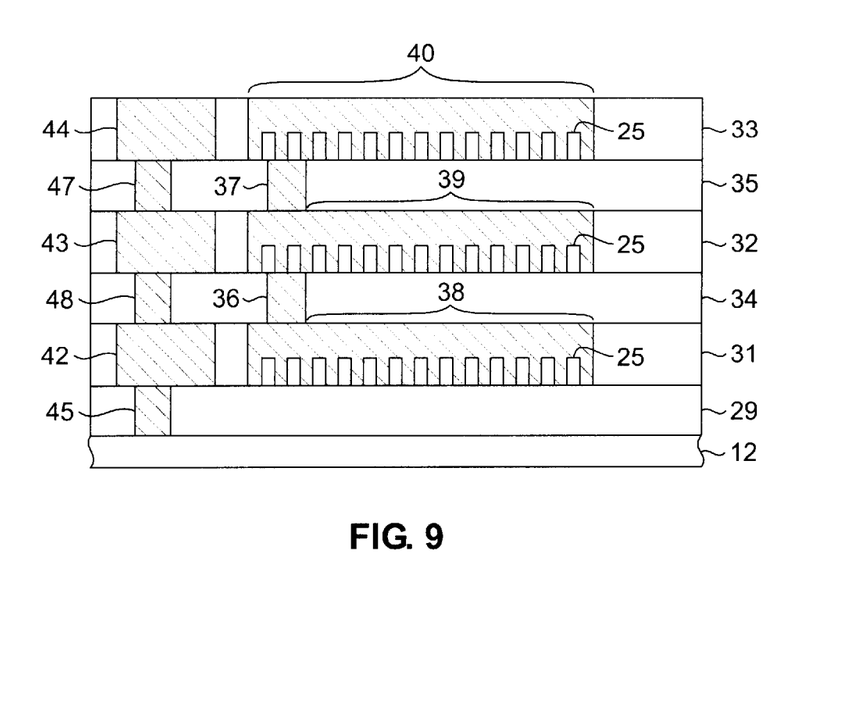
FIG. 9 is schematic sectional elevation view of an IC stack in which recessed islands are formed in interior metal/dielectric construction and in last-metal dielectric.

Including buried islands in metallization regions can also be applied to multiple interior levels of an IC. As illustrated in FIG. 9, an IC comprises semiconductor wafer 12 and a base dielectric 29 having a tungsten contact 45 formed therein. Any number, for example three, of metal dielectric layers 31, 32, 33, are formed separated by dielectric layers 34, 35 connected with vias 36, 37. Connectors 42, 43, 44 and vias 46, 47 provide conventional wiring to connect transistors and other components (not shown) in various layers of the IC metal probe pads 38, 39 each with recessed islands 25 are formed as described earlier for pads 23. The last metal surface 40, which is substantially identical to the surfaces of probe pads 38, 39 and which may be formed with essentially the same process steps, provides an optimized surface for mounting package 30.

Figure 10:
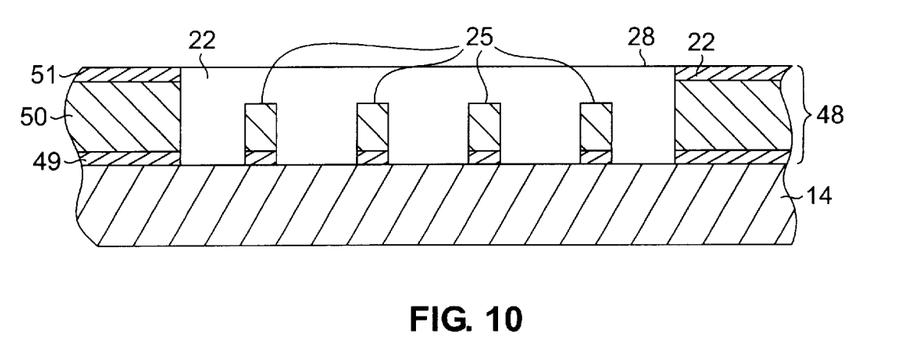
FIG. 10 is a sectional elevation view of a last-metal dielectric constructed in multi-layers.

Layer 18 is shown as formed of a single-material structure thus far. Layer 18 may alternatively be formed as a multilayer top metal dielectric stack 48 as shown in FIG. 10. Stack 48 includes a dielectric barrier layer 49 composed, for example, of SiN, SiC or SiCN. A middle dielectric layer 50 contains the material bulk of stack 48 and is composed of, for example, $SiO_2$. A cap layer 51 serving as a handmask composed of SiN or SiC, for example, is deposited atop layer 50. Forming of recessed islands 25 in stack 48 typically requires a multi-phase etch regimen for etching the different materials of layers 49, 50 and 51.

Figure 11:
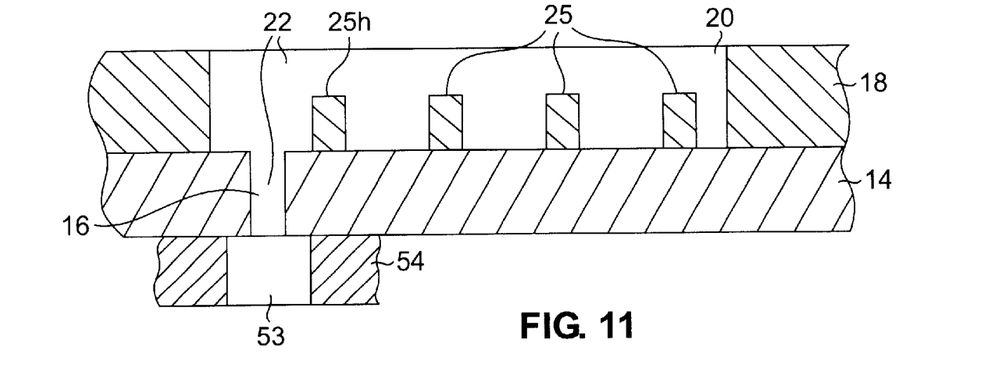
FIG. 11 is a sectional elevation view showing metal immersion of islands in a dual damascene structure.

The step of filling cavity 20 with metal to submerge recessed islands 25 may be applied in forming of dual damascene ICs where metallization steps deposit metals simultaneously in more than one layer. Referring to FIG. 11, the metallization 22 which submerges islands 25 concurrently fills vias such as via 16 in underlying dielectric layer 14. Via metallization extends electrical connection to element 53 in substrate 54. FIG. 11 also illustrates a preference for locating islands 25 in places within cavity 20 that avoid placing islands above a via region.

The dielectric of a single-material version of layer 18 may be any of several materials such as pure $SiO_2$; or $SiO_2$ doped with carbon or fluorine to which may be added hydrogen in substantial quantities or nitrogen in smaller quantities. Layer 18 dielectric may also be formed with organic polymers. The metallization 22 may for example, be copper, aluminum, or tungsten; or a selected alloy of these metals. "Low-k" dielectric material, that is, materials with dielectric constant $\leq 3.9$ may be preferred for use in dielectric layers 14 and 18 for the manufacture of high-performance IC structures. Materials having "low-k" are typically those having high carbon and/or fluorine content. Examples include organosilicate glass (OSG) and fluorosilicate glass (FSG). Other suitable materials for the dielectric in layer 18, both organic and inorganic, are well known. Low-k materials commonly have poor dielectric-metal adhesion due to weak bonds across the interface, for which the teachings of the invention compensate.

Figure 5C:
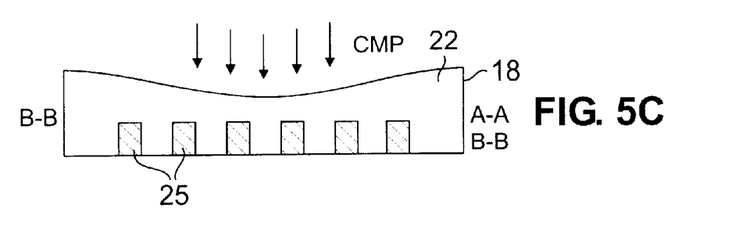
Figure 12A:
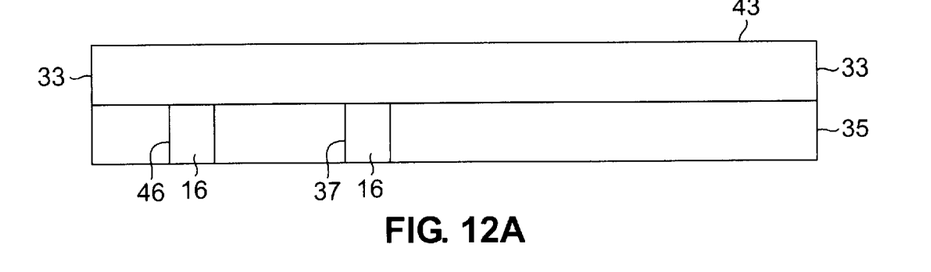
FIG. 12A–12D are sketches in elevation view showing structure resulting from successive processing stages in forming recessed islands.
Figure 12B:
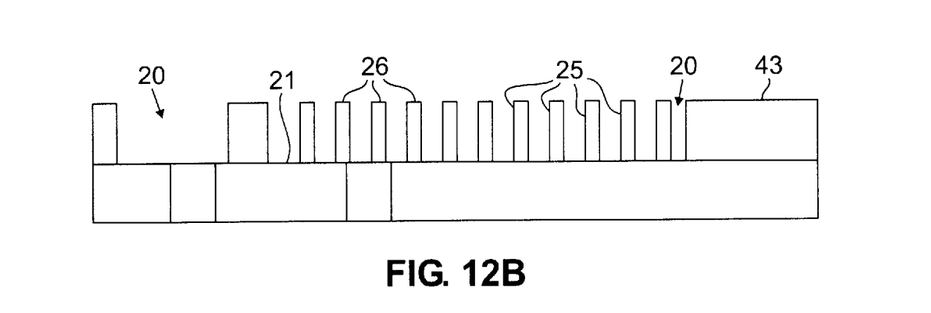
Figure 12C:
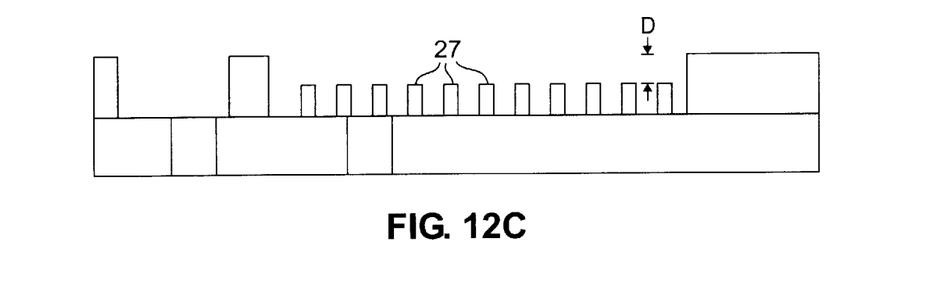
Figure 12D:
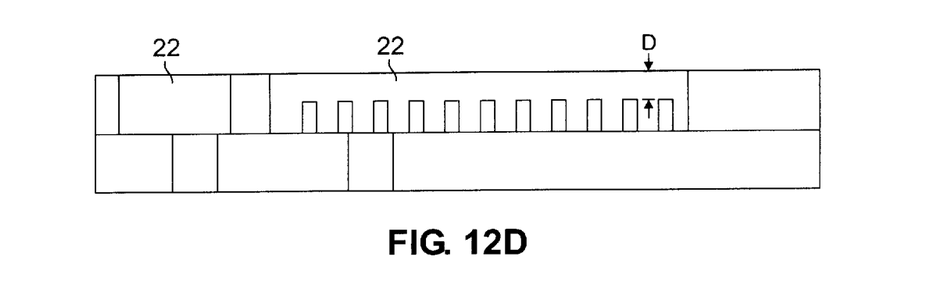
Figure 13:
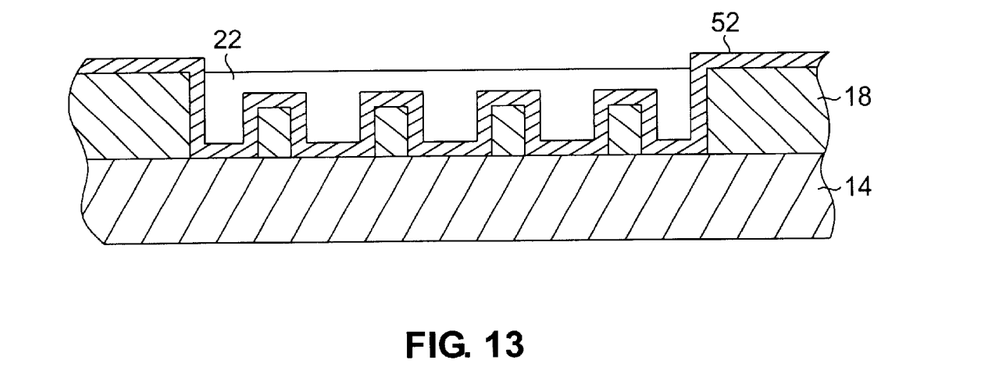
FIG. 13 is a sketch in elevation view showing use of barrier material over islands before metallization.
Figure 14:
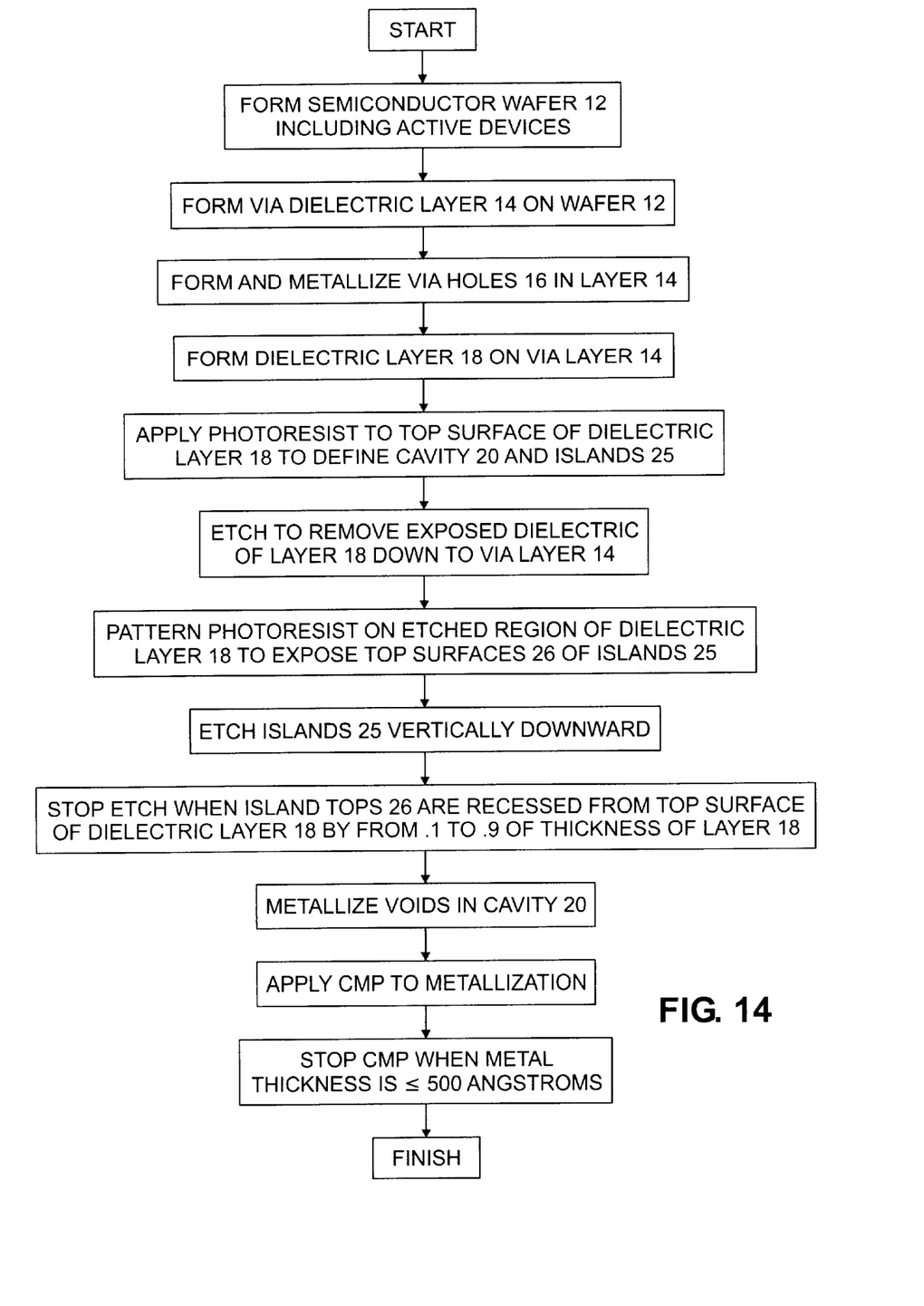
FIG. 14 is a flow chart of an illustrative process for forming recessed islands.

An exemplary process for forming a single-dielectric top metal layer with a final top surface suitable for either a test or probe pad or a mounting for attaching a wire or bump bonding package, is next described. As shown in FIG. 12A, dielectric layer 33 consisting of SiOF is deposited on via dielectric layer 35 by a CVD or alternatively a spin-on or other process. Next, in FIG. 12B conventional photolithography and etch techniques are used to form a cavity 20 in dielectric layer 33 with islands 25. Using a gaseous vertical anisotropic etch gas of $C_xH_yF_z$ with additions as needed of oxygen or nitrogen, the etch proceeds to the cavity floor 21. During this time islands 25 are formed out of the SiOF dielectric. Photoresist is then patterned to all areas except the top surfaces 26 of islands 25. Next, as shown in FIG. 5C, islands 25 are vertically anisotropically etched using a further gaseous etch regime down to a preselected plane where their top surfaces 26 are recessed below the top surface 43 of dielectric 33 by a predetermined distance "D". If the thickness of dielectric 33 is 1 micron, then it is preferred for the recessing distance "D" to be from approximately 0.25 to 0.75 microns. A barrier layer 52 shown in FIG. 13 may optionally be deposited on exposed surfaces of islands 25 and cavity 20 before applying metallization. Next, metal such as copper is deposited in remaining voids of cavity 20 by a process or combination of processes including sputtering, electroplating or CVD. Finally, CMP is applied resulting in the completed structure of FIG. 12D. FIG. 14 describes in flow chart terms the stages and sequences of the overall process.

What is claimed is:

1. An integrated circuit stack comprising
   a via layer,
   a dielectric layer formed on top of said via layer,
   an interior cavity formed in said dielectric layer,
     said cavity containing an array of islands,
     each said island having a base and a top surface,
     said base of each said island contacting the top surface of said via layer,
     metallization filling remaining voids in said cavity to submerge said islands in metal,
   the top surface of said metallization being vertically separated from said top surfaces of said islands by a controlled distance.

2. An integrated circuit stack in accordance with claim 1, wherein
   said controlled distance is at least 500 Angstroms.

3. An integrated circuit stack in accordance with claim 2, wherein said dielectric layer has a thickness "h"; and wherein said island top surfaces and said metallization top surface are vertically separated to within a range of substantially from 0.10 h to 0.90 h.

4. An integrated circuit stack in accordance with claim 2, wherein said dielectric layer has a thickness "h"; and wherein said island top surfaces and said metallization top surface are vertically separated to within a range of substantially from 0.25 h to 0.75 h.

5. An integrated circuit stack in accordance with claim 3, wherein said is lands are shaped irregularly at their said bases, and are embedded in said cavity in locations which interrupt long horizontal linear runs of said metallization.

6. An integrated circuit stack in accordance with claim 5, wherein said islands comprise a waist section having a reduced vertical cross-sectional area for gripping said metallization onto said islands.

7. An integrated circuit stack in accordance with claim 3, further comprising
   one or more additional said dielectric layers, each said additional dielectric layer being constructed in accordance with the said dielectric layer described in claim 3,
   all said dielectric layers being connected in a stack, and
   a wire-or solder- bonded package adhered to the topmost said dielectric layer.

8. An integrated circuit stack in accordance with claim 3, wherein the said islands located in the interior area of said cavity extend vertically closer to said metallization top surface than do the islands located along the perimeter of said cavity.

9. An integrated circuit stack in accordance with claim 3, wherein said dielectric layer is a single material formed from the group consisting of $SiO_2$, $SiO_2$ doped with carbon or fluorine, and organic polymers.

10. An integrated circuit stack in accordance with claim 3, wherein said dielectric layer and said via layer are formed from materials having a dielectric constant $\leq 3.9$.

11. An integrated circuit in accordance with claim 3, wherein said dielectric layer consists of a barrier layer, a dielectric material and a cap layer.

12. An integrated circuit in accordance with claim 3, wherein said via layer further comprises one or more via holes connecting with said cavity in locations outside of vertical alignment with any said island in said cavity; and wherein said metallization in said via holes is continuous with said metallization in said cavity.

13. A process for forming an integrated circuit stack, comprising the steps of:

forming a via layer;

forming a dielectric layer on top of said via layer;

applying photoresist to said dielectric layer to define an interior cavity and an array of islands within said cavity;

in a first vertical anisotropic etch step, etching away unmasked dielectric in said cavity;

with photoresist patterned on surface areas to expose the top surfaces of said islands, in a second etch step vertically anisotropically etching said islands down to a preselected plane where said island top surfaces are recessed below the top surface of said dielectric layer;

depositing metallization in remaining voids of said cavity to submerge said islands in metal; and applying CMP to said metallization to maintain at least 500 Angstroms separation between said island top surfaces and the final polished metallization top surface.

14. The process of claim 13, wherein said dielectric layer has a thickness "h"; and wherein said CMP step effects a vertical separation of said island top surfaces and said metallization top surface to within a range substantially of from 0.10 h to 0.90 h.

15. The process of claim 13, wherein said dielectric layer has a thickness "h"; and wherein said CMP step effects a vertical separation of said island top surfaces and said metallization top surface to within a range substantially of from 0.25 h to 0.75 h.

* * * * *